US012648286B2

(12) United States Patent
Jung et al.

(10) Patent No.: US 12,648,286 B2
(45) Date of Patent: Jun. 2, 2026

(54) DISPLAY DEVICE

(71) Applicant: LG ELECTRONICS INC., Seoul (KR)

(72) Inventors: Woosik Jung, Seoul (KR); Yanghyun Kim, Seoul (KR); Jonghwa Won, Seoul (KR); Wonsik Kim, Seoul (KR); Wonseok Han, Seoul (KR); Jonggon Shin, Seoul (KR); Jongjin Woo, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 593 days.

(21) Appl. No.: 18/023,976

(22) PCT Filed: Aug. 31, 2020

(86) PCT No.: PCT/KR2020/011640
§ 371 (c)(1),
(2) Date: Feb. 28, 2023

(87) PCT Pub. No.: WO2022/045415
PCT Pub. Date: Mar. 3, 2022

(65) Prior Publication Data
US 2023/0327063 A1     Oct. 12, 2023

(51) Int. Cl.
*H10H 29/85*        (2025.01)
*H01L 25/075*       (2006.01)
*H10H 20/85*        (2025.01)
*H10H 20/857*       (2025.01)
*H10H 20/858*       (2025.01)
*H10H 29/49*        (2025.01)

(52) U.S. Cl.
CPC ....... *H10H 29/858* (2025.01); *H01L 25/0753* (2013.01); *H10H 20/8506* (2025.01); *H10H 20/857* (2025.01); *H10H 20/8582* (2025.01); *H10H 29/49* (2025.01); *H10H 29/857* (2025.01); *H10H 29/8582* (2025.01)

(58) Field of Classification Search
None
See application file for complete search history.

(56) References Cited

U.S. PATENT DOCUMENTS

| | | | |
|---|---|---|---|
| 2010/0096993 A1* | 4/2010 | Ashdown | H05B 45/22 |
| | | | 315/291 |
| 2018/0254226 A1* | 9/2018 | Iguchi | H01L 25/0753 |
| 2020/0266180 A1 | 8/2020 | Pendse | |

FOREIGN PATENT DOCUMENTS

| | | |
|---|---|---|
| JP | 2011-113989 A | 6/2011 |
| KR | 10-2017-0099324 A | 8/2017 |
| KR | 10-2018-0078480 A | 7/2018 |
| KR | 10-2019-0006430 A | 1/2019 |

* cited by examiner

*Primary Examiner* — Feifei Yeung Lopez

(74) *Attorney, Agent, or Firm* — Birch, Stewart, Kolasch & Birch, LLP

(57)        ABSTRACT

A display device according to one embodiment of the present disclosure comprises: a wiring board having an electrode line formed on the front surface thereof; and a plurality of semiconductor light-emitting elements disposed on the wiring board and electrically connected to each other by the electrode line, wherein the wiring board is configured to include at least two physically divided sub-boards, and a heat dissipation passage is formed between the sub-boards.

12 Claims, 11 Drawing Sheets

【FIG. 1】
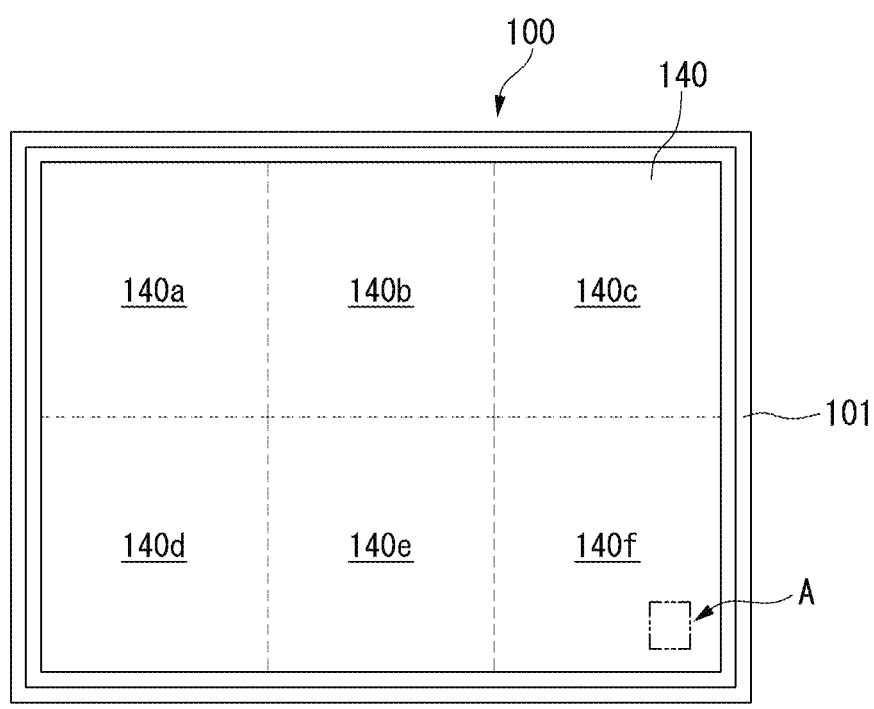

【FIG. 2】
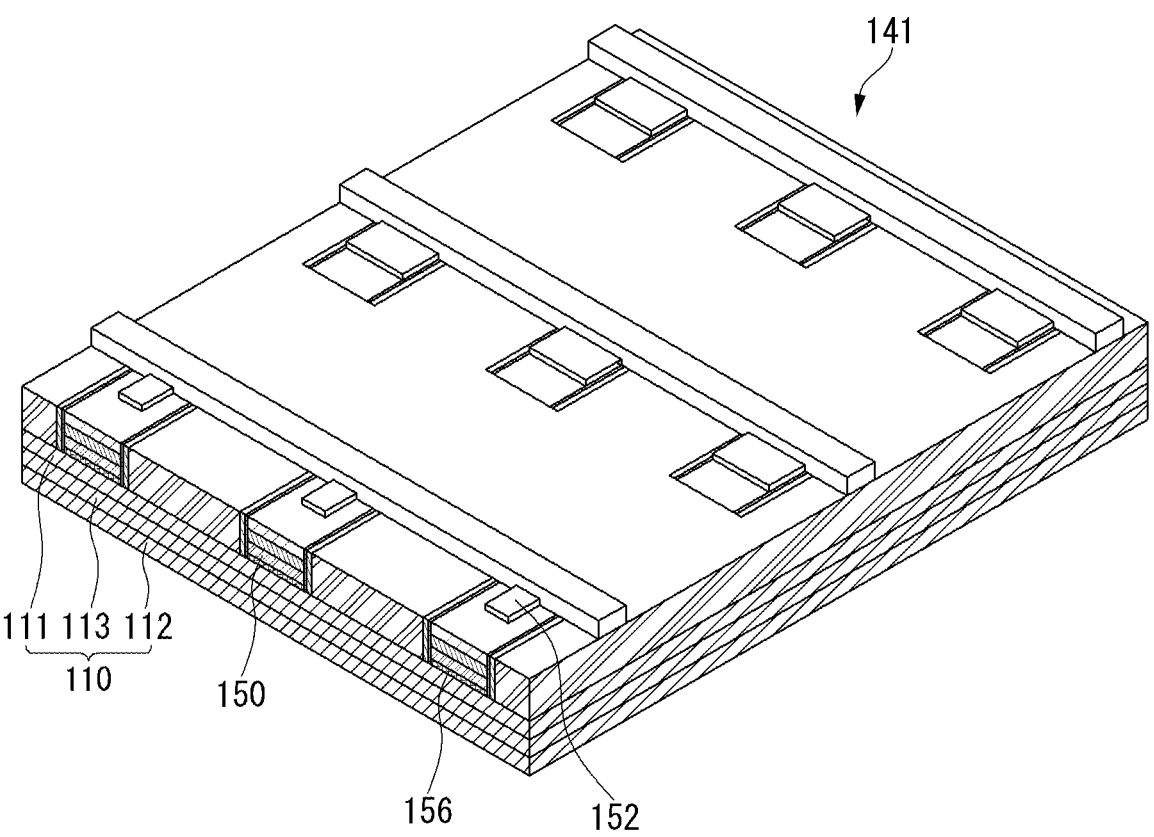
【FIG. 3】
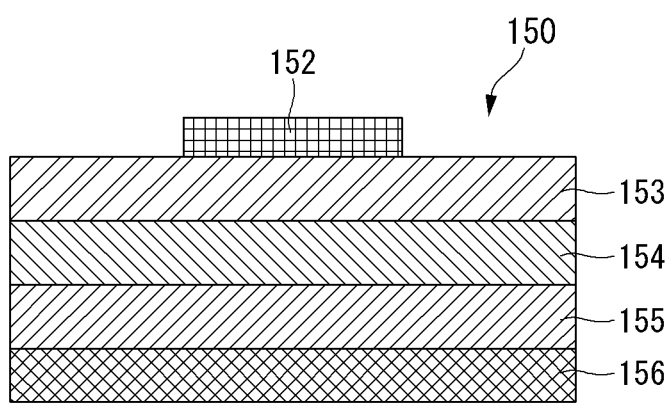

【FIG. 4】
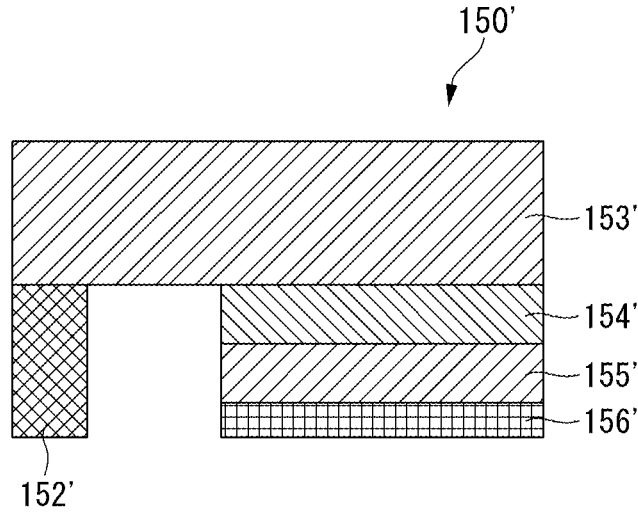
【FIG. 5】
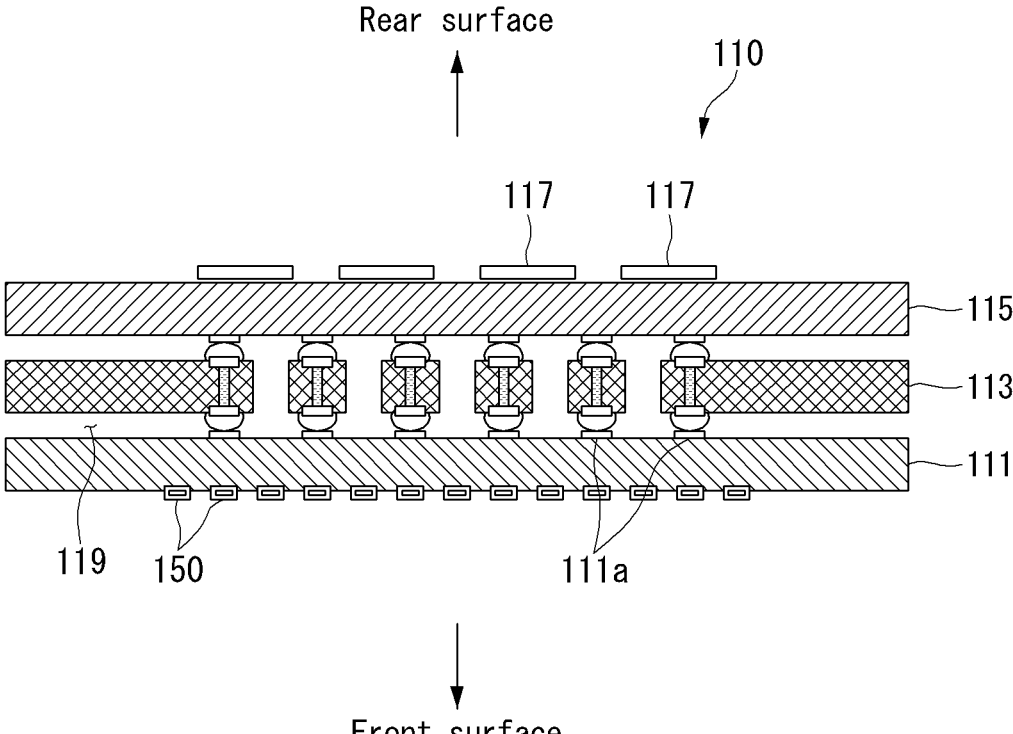

【FIG. 6】
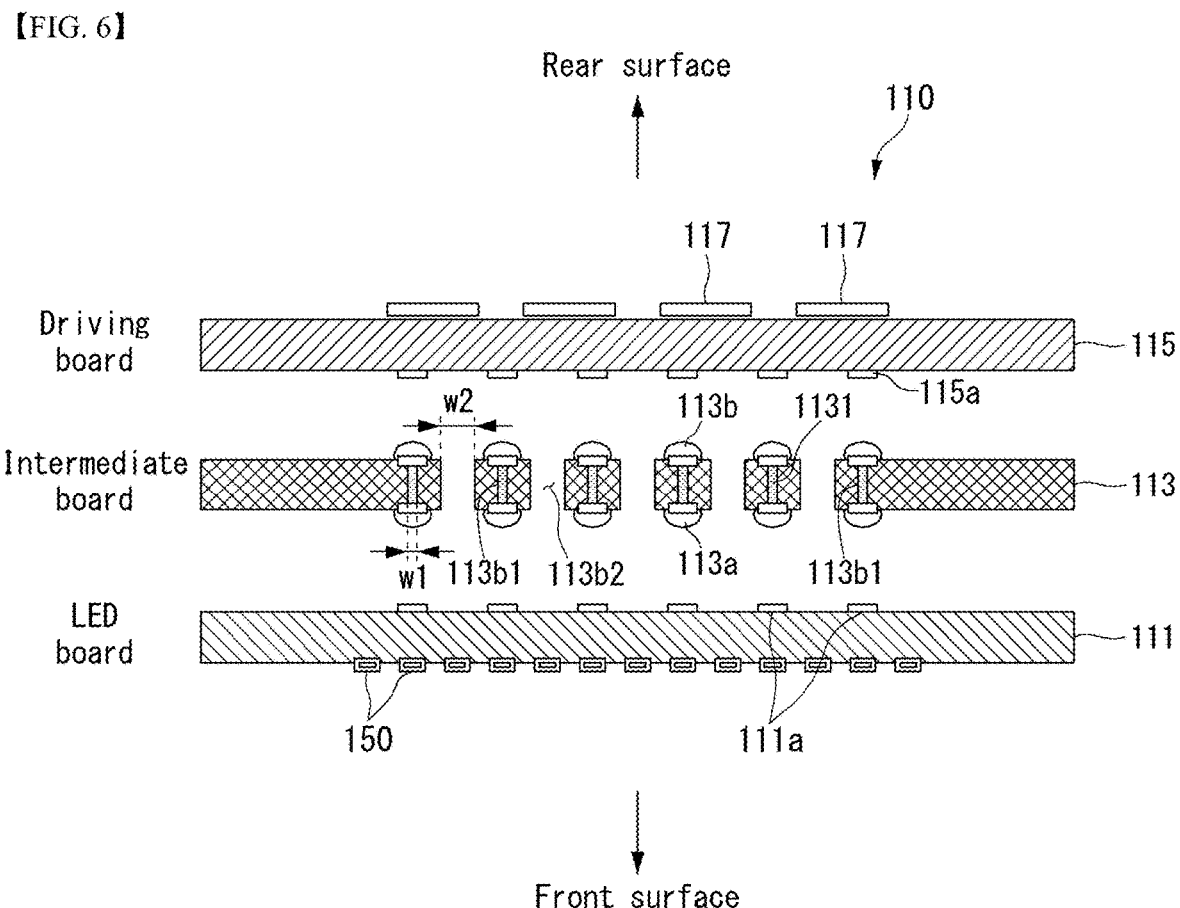
【FIG. 7】
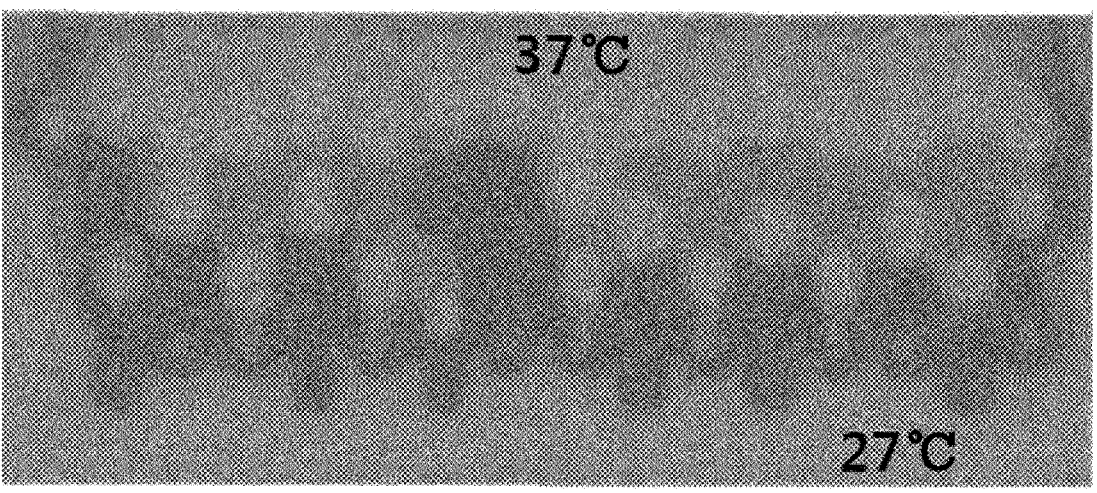

【FIG. 8】
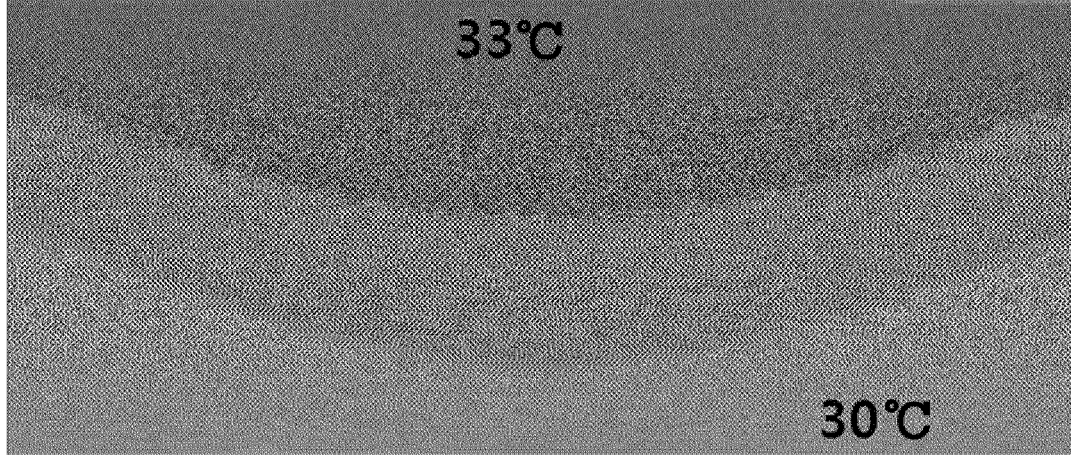
【FIG. 9】
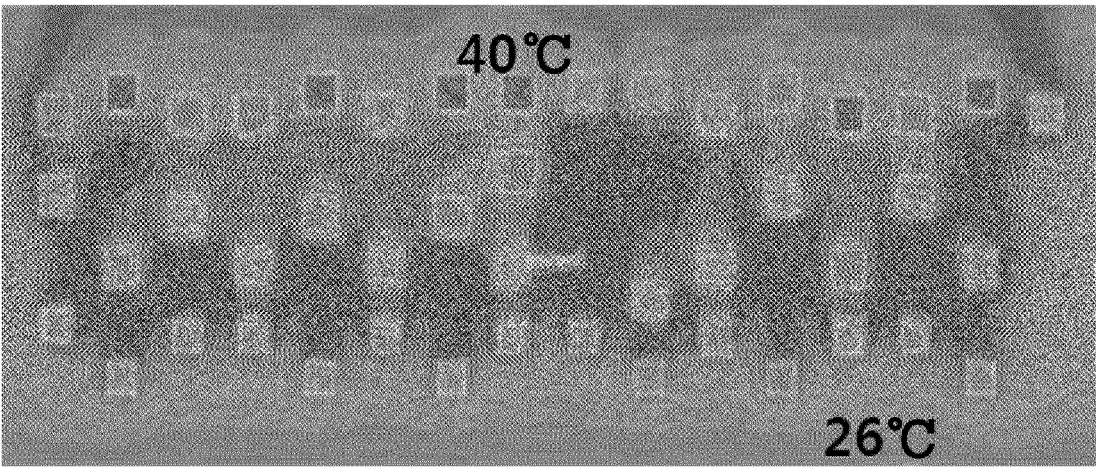
【FIG. 10】
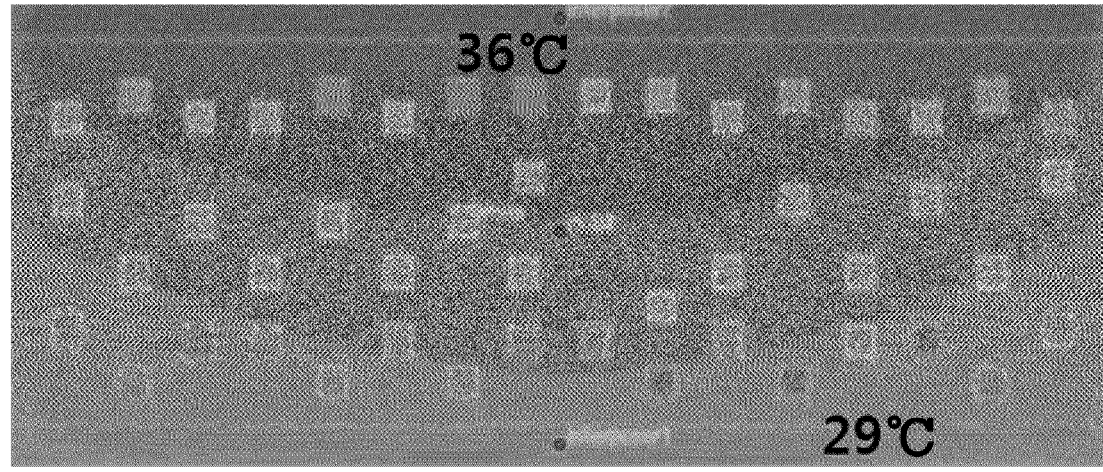

【FIG. 11】
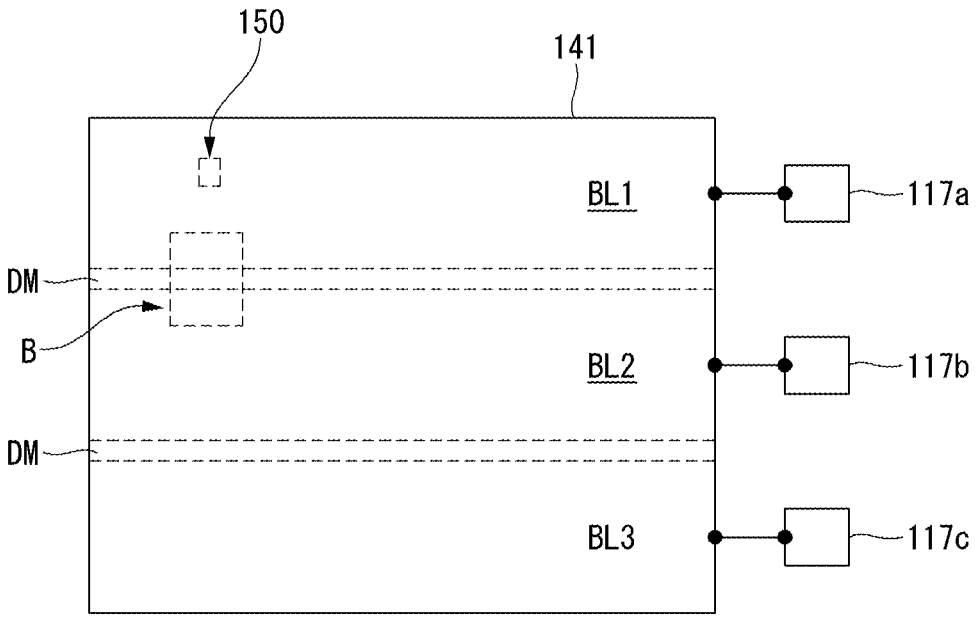
【FIG. 12】
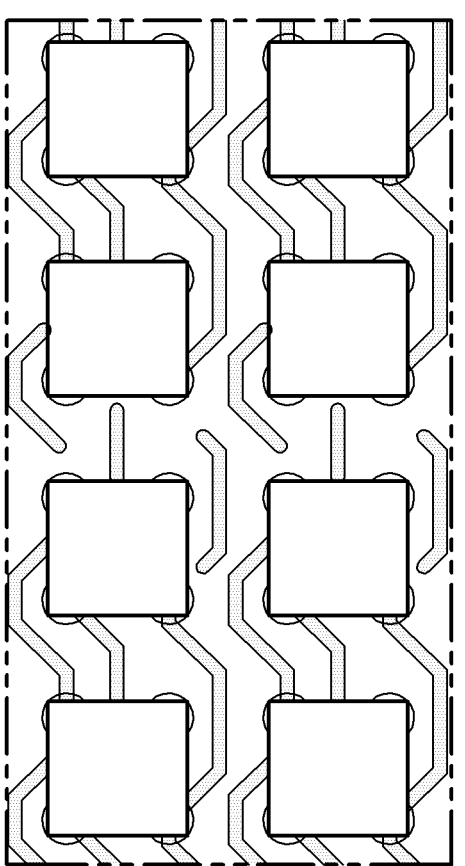

【FIG. 13】
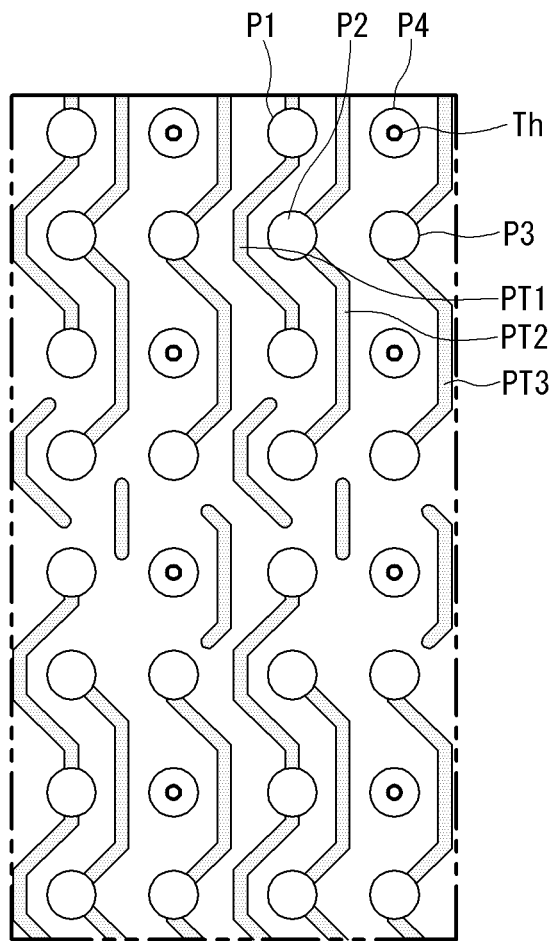
【FIG. 14】
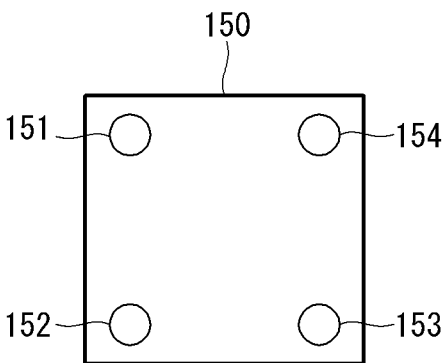

【FIG. 15】
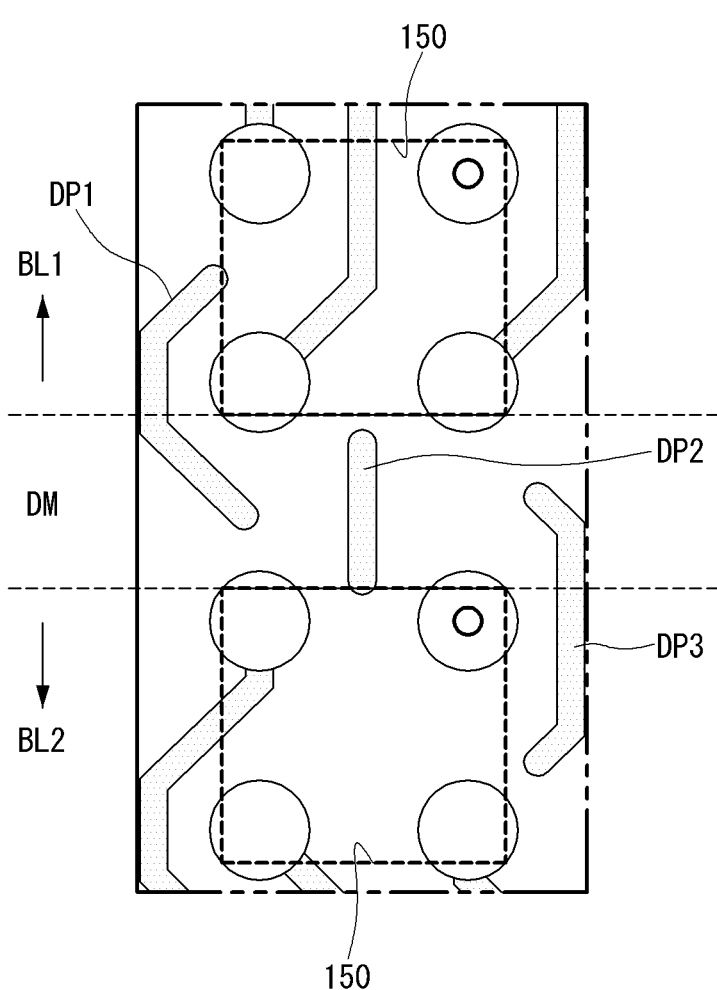

【FIG. 16】
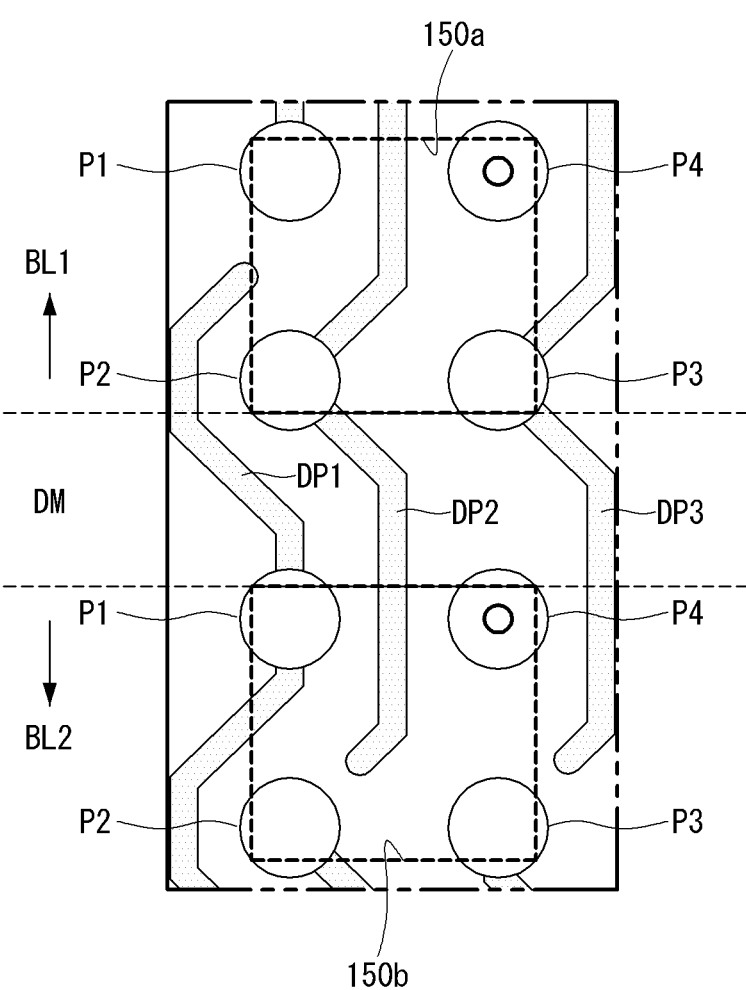

【FIG. 17】
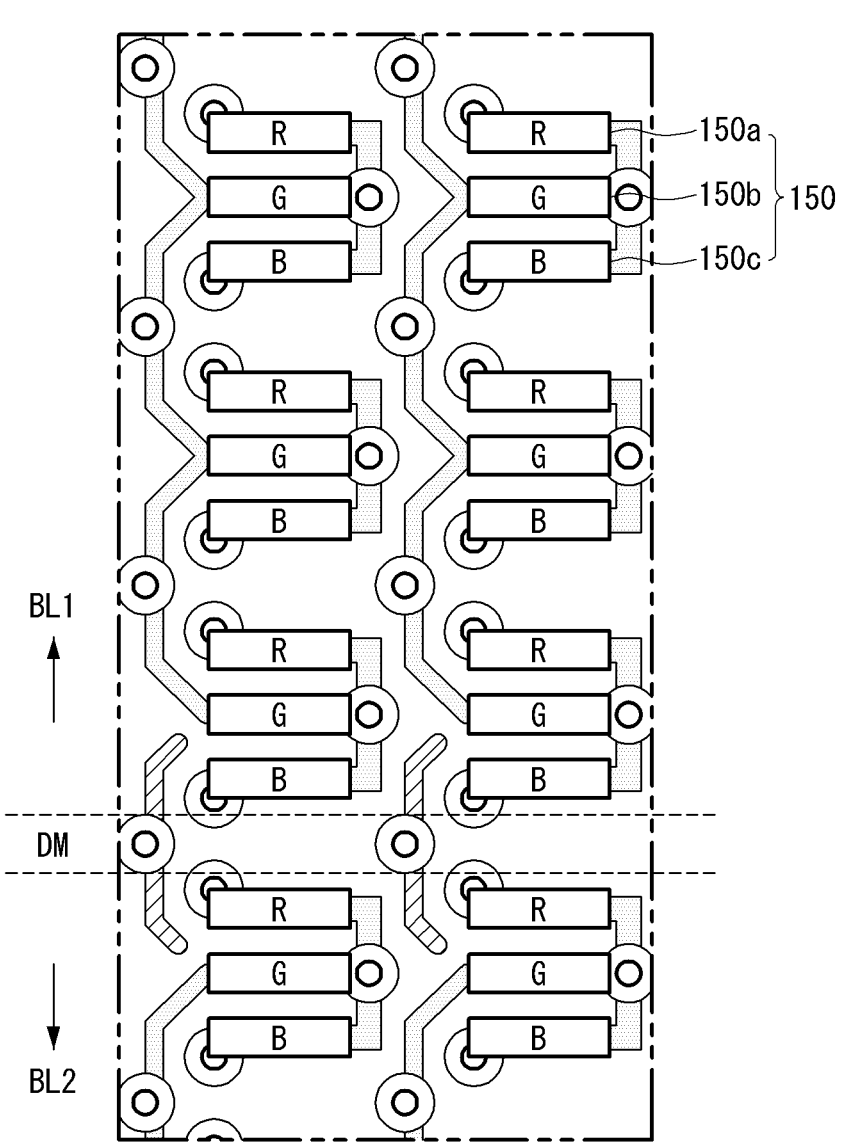

【FIG. 18】
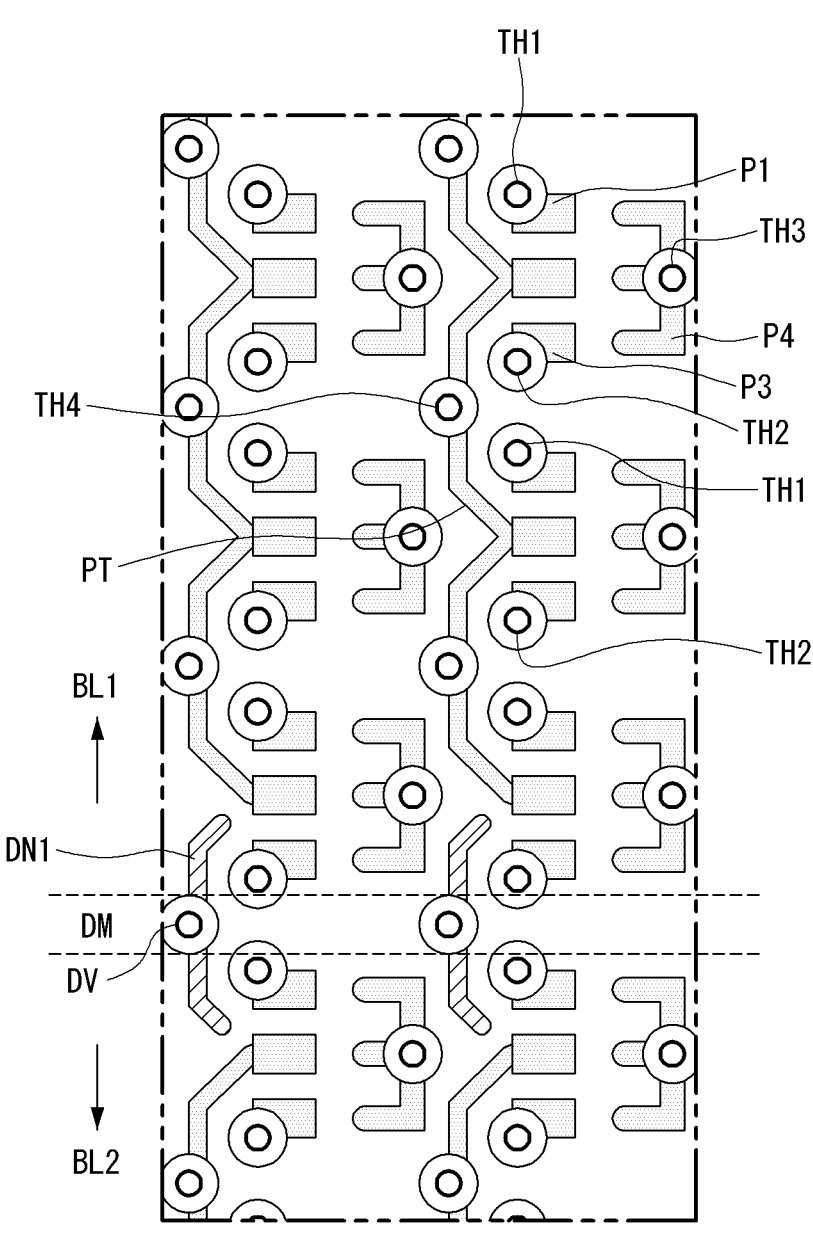

DISPLAY DEVICE

CROSS-REFERENCE TO RELATED APPLICATION

This application is the National Stage filing under 35 U.S.C. 371 of International Application No. PCT/KR2020/011640 filed on Aug. 31, 2020, the contents of which are all hereby incorporated by reference herein in their entirety.

TECHNICAL FIELD

The present disclosure relates to a display device, and particularly, to a display device using semiconductor light-emitting elements having a size of several tens of μm to several hundreds of μm.

BACKGROUND

In recent years, display devices having excellent characteristics such as thinness and flexibility have been developed in a display technology field. In contrast, currently commercialized major displays are represented by Liquid Crystal Display (LCD) and Active Matrix Organic Light Emitting Diodes (AMOLED).

However, in the case of the LCD, there are problems such as not fast response time and a difficulty in implementation of flexibility, and in the case of the AMOLED, there are vulnerabilities such as short lifespan and poor mass production yield.

On the other hand, Light Emitting Diode (LED) is a well-known semiconductor light-emitting element that converts current into light, and starting with the commercialization of red Leeds using GaAsP compound semiconductors in 1962, along with GaP:N series green LEDs, the LED has been used as a light source for display images in electronic devices including information communication devices. Accordingly, a method of implementing a display using the semiconductor light-emitting element to solve the above problem can be proposed.

On the other hand, such a light emitting diode is mounted on a board and operated, and since a lot of heat is generated in this process, the heat generated in the operation process must be quickly discharged to the outside of the device.

In addition, the light emitting diodes are connected to each other by a conductive pattern formed on the front surface of the board and to a driver IC disposed on the rear surface of the board. However, since the light emitting diodes are connected to the driver IC in units of blocks, there is a problem in that a line is viewed like a horizontal line because a pattern is not connected between blocks.

SUMMARY

The present disclosure is proposed to solve the problem, and an object of the present disclosure is to prevent horizontal lines from being viewed by improving the shape of a pattern formed on the front surface of a board.

Another object of the present disclosure is to rapidly dissipate heat generated during the operation of light emitting diodes by improving the structure of a board on which the light emitting diodes are installed.

Technical Solution

A display device according to one embodiment of the present disclosure includes: a wiring board having an electrode line formed on a front surface thereof; and a plurality of semiconductor light-emitting elements disposed on the wiring board and electrically connected to each other by the electrode line, in which the wiring board is configured to include at least two physically divided sub-boards. The at least two physically divided sub-boards are spaced apart from each other to form a heat dissipation passage therebetween.

The wiring board includes a first sub-board having the plurality of electrode lines formed on a front surface thereof and a first pad connected to the plurality of electrode lines formed on a rear surface thereof, and a second sub-board having a driver IC generating electric signals transmitted to the semiconductor light-emitting elements disposed on a rear surface thereof and a second pad connected to the driver IC, which is formed on the front surface thereof.

The wiring board further includes a third sub-board located between the first sub-board and the second sub-board. The third sub-board includes a third pad connected to the first pad of the first sub-board and disposed on a front surface thereof, and a fourth pad electrically connected to the second pad of the second sub-board and disposed on a rear surface.

The third sub-board includes a plurality of contact holes connecting the third and fourth pads and heat radiation holes formed between adjacent first and second contact holes among the plurality of contact holes.

The plurality of contact holes has connection electrodes physically connecting the third and fourth pads, and the heat dissipation holes are emptied.

The first pad and the third pad, and the second pad and the fourth pad are electrically and physically connected by a solder having a predetermined height.

The solder includes a first solder melting at a first temperature and a second solder melting at a temperature higher than the first temperature.

All of the sub-boards configured as such are constituted by printed circuit boards (PCBs).

In a display device according to an embodiment of the present disclosure, a wiring board has a shape in which at least two sub-boards are bonded together, and the sub-board includes a contact hole functioning as a heat dissipation passage. Therefore, heat generated in the light emitting diode during operation can be discharged through the contact hole provided on the sub-board.

In addition, since electrode lines are also formed in a dummy area, the display device according to an embodiment of the present disclosure can prevent the previous problem of horizontal lines being viewed.

BRIEF DESCRIPTION OF THE DRAWINGS

FIG. 1 is a conceptual diagram illustrating an example of a display device using a semiconductor light-emitting element according to an embodiment of the present disclosure.

FIG. 2 is a partial enlarged diagram of part A of the display device of FIG. 1.

FIG. 3 is an enlarged diagram of the semiconductor light-emitting element of FIG. 2.

FIG. 4 is an enlarged diagram illustrating another embodiment of the semiconductor light-emitting element of FIG. 2.

FIGS. 5 and 6 are diagrams for describing a wiring board of one example.

FIGS. 7 to 10 are diagrams illustrating an effect of the wiring board.

FIG. 11 is a diagram for describing the semiconductor light-emitting element which operates in units of blocks.

FIG. 12 is an enlarged diagram of part "B" of FIG. 11.

FIG. 13 is a diagram illustrating a state in which the semiconductor light-emitting element is removed from FIG. 12.

FIG. 14 is a diagram illustrating an arrangement of electrodes of the semiconductor light-emitting element.

FIG. 15 is an enlarged diagram of a dummy pattern.

FIG. 16 is a diagram illustrating another example of the dummy pattern.

FIG. 17 is a diagram illustrating an example in which the semiconductor light-emitting element is packaged for each sub-pixel.

FIG. 18 is a diagram illustrating a state in which the semiconductor light-emitting element is removed from FIG. 17.

DETAILED DESCRIPTION

In the following description, an embodiment of the present disclosure will be described in detail with reference to the accompanying drawings to be implemented by those skilled in the art.

However, the present disclosure may be modified in various different ways, all without departing from the spirit or scope of the present disclosure. In addition, a part which is not related with the description may be simplified or omitted in the drawings in order to clearly describe the present disclosure. Further, various embodiments illustrated in the drawings are exemplarily presented, and components are simplified and illustrated differently from actual components for convenience of description.

In the following detailed description, the same components which have no difference according to the embodiments are denoted by the same reference numerals, and a description thereof is not repeated.

FIG. 1 is a conceptual diagram illustrating an example of a display device using a semiconductor light-emitting element according to an embodiment of the present disclosure, FIG. 2 is a partial enlarged diagram of part A of the display device of FIG. 1, FIG. 3 is an enlarged diagram of the semiconductor light-emitting element of FIG. 2, and FIG. 4 is an enlarged diagram illustrating another embodiment of the semiconductor light-emitting element of FIG. 2.

According to the illustration, information processed by a control unit (not illustrated) of the display device 100 may be output by a display module 140. A closed-loop type case 101 covering a border of the display module may form a bezel of the display device.

As illustrated, the display device 100 according to an embodiment may include a plurality of display modules 140a to 140f and may be configured to display one screen or unlike illustrated, may include only one display module 140 and may be implemented as the display device. In FIG. 1, an example in which six display modules 140a to 140f are gathered and implemented as the display device is illustrated.

The display module 140 may include a panel 141 displaying an image, and the panel 141 may include a semiconductor light-emitting element 150 having a micro size and a wiring board 110 on which the semiconductor light-emitting element 150 is mounted.

A wire may be formed on the wiring board 110 and connected to an n-type electrode 152 and a p-type electrode 156 of the semiconductor light-emitting element 150. Through this, the semiconductor light-emitting element 150 as an individual pixel that self-emits light may be provided on the wiring board 110.

The image displayed on the panel 141 as visual information is implemented by independently controlling light emission of sub-pixels arranged in a matrix form through the wire.

In the present disclosure, as one type of the semiconductor light-emitting element 150 that coverts current into light, a micro light emitting diode (LED) is illustrated. The micro LED may become a light emitting diode having a small size of 1000 micrometers or less. In the semiconductor light emitting element 150, blue, red, and green are respectively provided in light emitting areas, respectively and a unit pixel may be implemented by a combination thereof. That is, the unit pixel means a minimum unit for implementing one color, and at least three micro LEDs may be provided in the unit pixel.

More specifically, referring to FIG. 3, the semiconductor light-emitting element 150 may have a vertical structure. For example, the semiconductor light-emitting element 150 may be implemented as a high-power light-emitting element that is mainly made of gallium nitride (GaN), and includes indium (In) and/or aluminum (Al) added together to emit various lights including blue.

Such a vertical semiconductor light-emitting element includes a p-type electrode 156, a p-type semiconductor layer 155 formed on the p-type electrode 156, an active layer 154 formed on the p-type semiconductor layer 155, an n-type semiconductor layer 153 formed on the active layer 154, and an n-type electrode 152 formed on the n-type semiconductor layer 153. In this case, the p-type electrode 156 located on the lower portion may be electrically connected to a p-electrode of the wiring board, and the n-type electrode 152 located on the upper portion may be electrically connected to an n-electrode on the upper side of the semiconductor light-emitting element.

The vertical semiconductor light emitting diode 150 has a great advantage in that a chip size may be reduced because the electrodes may be arranged vertically.

As another example, referring to FIG. 4, the semiconductor light-emitting element may be a flip chip type light-emitting element.

As such an example, the semiconductor light-emitting element 150' includes a p-type electrode 156', a p-type semiconductor layer 155' formed on the p-type electrode 156', an active layer 154' formed on the p-type semiconductor layer 155', an n-type semiconductor layer 153' formed on the active layer 154', and an n-type electrode 152' disposed on the n-type semiconductor layer 153' to be spaced apart from the p-type electrode 156' in a horizontal direction. In this case, both the p-type electrode 156' and the n-type electrode 152' may be electrically connected to the p-electrode and the n-electrode of the wiring board at the lower portion of the semiconductor light-emitting element.

Each of the vertical semiconductor light emitting diode and the horizontal semiconductor light emitting diode may be a green semiconductor light-emitting element, a blue semiconductor light-emitting element, or a red semiconductor light-emitting element. The green semiconductor light-emitting element and the blue semiconductor light-emitting element may be implemented as a high-power light-emitting element that is mainly made of gallium nitride (GaN), and includes indium (In) and/or aluminum (Al) added together to emit green or blue light. As an example, the semiconductor light-emitting element may be a gallium nitride thin film formed in various layers such as n-Gan, p-GaN, AlGaN, and InGaN, and specifically, the p-type semiconductor layer is P-type GaN, and the n-type semiconductor layer may be N-type GaN. However, in the case of the red semiconductor light-emitting element, the p-type semiconductor layer may be P-type GaAs, and the n-type semiconductor layer may be N-type GaAs.

In addition, the p-electrode side of the p-type semiconductor layer may be P-type GaN doped with Mg, and the n-electrode side of the n-type semiconductor layer may be N-type GaN doped with Si. In this case, the semiconductor light-emitting elements described above may be semiconductor light-emitting elements without the active layer.

Hereinafter, the wiring board will be described in detail with reference to the accompanying drawings.

In a preferred example, the wiring board 110 is configured to include at least two sub-boards that are physically divided, and the sub-boards are separated from each other to form a heat dissipation passage through which heat is discharged. Accordingly, it is possible to effectively block heat generated during the operation process of the device, and in particular, heat generated during the operation process of the driver IC from being transmitted to the front surface of the wiring board 110, that is, the semiconductor light-emitting element.

This will be described in detail with reference to FIGS. 5 to 10.

FIG. 5 is a cross-sectional view of a wiring board according to an embodiment, and FIG. 6 illustrates divided sub-boards. In addition, FIGS. 7 to 10 are diagrams illustrating a simulation state in order to find an effect of the wiring board.

In an embodiment, the wiring board 110 may be configured to include first to third sub-boards 111, 113, and 115. The first sub-board 111, the second sub-board 113, and the third sub-board 115 are sequentially arranged, and the first sub-board 111 is disposed on the front surface and the third sub-board 115 is disposed on the rear surface. Therefore, the second sub-board 113 is located between the first sub-board 111 and the third sub-board 115 to serve to electrically connect the first sub-board 111 and the third sub-board 115. Each of the first to third sub-boards is constituted by a printed circuit board (PCB).

The first sub-board 111 may be configured such that the semiconductor light-emitting element 150 is mounted on the front surface and the rear surface includes a first pad 111a. On the front surface, the semiconductor light-emitting elements 150 are configured to be connected to each other by electrode lines, and this will be described below in detail.

The first pad 111a formed on the rear surface serves to electrically connect the electrode lines formed on the front surface of the first sub-board 111 to the second sub-board 113. The shape of the first pad 111a may be variously formed without a particular limitation.

The second sub-board 113 is located between the first sub-board 111 and the third sub-board 115 to electrically connect the first sub-board 111 and the third sub-board 115. To this end, the second sub-board 113 is configured to include a plurality of first contact holes 113b1. Third and fourth pads 113a and 113b are disposed above and below the first contact hole 113b1, and the first contact hole 113b1 electrically connects the third and fourth pads 113a and 113b through the connection electrode 1131 formed in the contact hole.

Further, a second contact hole 113b2 may be further disposed between adjacent first contact holes among the plurality of first contact holes 113b1. The second contact hole 113b2 serves as a passage through which the heat generated during the operation process of the semiconductor light-emitting element 150 installed on the first sub-board 111 is exhausted. The first contact port 113b2 is emptied for efficient exhaust. In addition, a first width w1 of the first contact hole 113b1 is smaller than a second width w2 of the second contact hole 113b3 so that heat is configured to be easily exhausted.

A driver IC 117 is installed on the rear surface of the third sub-board 115 to apply an electric signal to the semiconductor light-emitting element 150. Although described later, the semiconductor light-emitting elements 150 are not individually driven, and operate to be driven in units of blocks.

In one example, the driver IC 117 may be formed for each block of the semiconductor light-emitting element 150 and connected to the semiconductor light-emitting element 150, but is not particularly limited thereto.

Each driver IC 117 is electrically connected to the fourth pad 115a formed on the front surface of the third sub-board 115.

The physically divided first to third sub-boards 111, 113, and 115 configured as such may be located at a jig, and then connected to each other by using a solder. In the jig, the first pad 111a formed in the first sub-board 111 is disposed to face the second pad 113a provided in the second sub-board 113, and the third sub-board 115 is disposed to face the third pad 113b provided on the rear surface of the second sub-board 113.

In addition, the solder may be supplied between the first pad 111a and the second pad 113a, and between the fourth pad 115a and the third pad 113b, and while the solder is thermally cured, the first to third sub-boards may be formed as one wiring board.

In this case, the solder may adopt two types of solders having different melting temperatures in order to make the work easier and to form a height between the boards. That is, the solder includes a first solder melting at a first temperature and a second solder melting at a temperature higher than the first temperature.

In one example, the second solder may be formed on the second and third pads 113a and 113b provided on the second sub-board 113, and the first solder may be formed on each of the first pad 111a and the fourth pad 115a formed on the first sub-board 111 and the third sub-board 115, respectively. Alternatively, in contrast, positions of the first solder and the second solder may be changed.

Since the melting temperature of the second solder is higher than that of the first solder, when the first to third sub-boards are attached by melting the solder, in the case where the first solder is heated to a melting temperature, the second solder is not melt and maintains a shape thereof, so it is easy to form a gap between the first sub-board and the second sub-board and between the second sub-board and the third sub-board.

When the wiring board is formed as such, the heat generated from the driver IC may be discharged through a heat dissipation passage 119 between the third sub-board and the second sub-board, and discharged through the heat dissipation passage provided between the first sub-board and the second sub-board through heat dissipation holes 113b1 and 113b2 provided in the second sub-board.

Further, the heat generated during the operation process of the semiconductor light-emitting element may also be easily discharged through the heat dissipation passage 119 provided inside the wiring board.

Further, since the wiring board 110 has a multi-layer structure, a design freedom degree may be increased. That is, which pattern of a wiring board constituted by one layer in the related art is to be modified, the entirety of the wiring board should be modified, but since the wiring board has the multi-layer structure as in the embodiment, the wiring board of the sub-board is easily modified.

Hereinafter, an effect of the wiring board 110 configured as such will be described with reference to FIGS. 7 to 10.

FIGS. 7 and 9 illustrate a distribution of heat generated during the operation process of a display device having wiring boards bonded in the related art. FIG. 7 illustrates a temperature distribution of a front surface side, i.e., a surface to which the semiconductor light-emitting element is attached, and FIG. 9 illustrates a temperature distribution of a rear surface on which the driver IC is disposed.

As illustrated, it is investigated that during the operation process, the front surface rises from a minimum of 27° C. to a maximum of 37° C., and the rear surface rises from a minimum of 26° C. to a maximum of 40° C.

In comparison with this, FIGS. 8 and 10 illustrate a state of measuring the temperature of the device including the wiring board according to the present disclosure described above. FIG. 8 illustrates the state of measuring the temperature of the front surface and FIG. 10 illustrates the state of measuring the temperature of the rear surface.

As illustrated, it is investigated that the front surface according to the present disclosure rises from a minimum of 30° C. to a maximum of 40° C. Compared with the related art, the minimum temperature rises, but a temperature change is rapidly reduced like a case where a temperature difference is 10° C. in the relate art, while 3° C. in the present disclosure, and there is an effect that the maximum temperature also becomes lower than the maximum temperature in the related art by approximately 4° C.

Further, according to the present disclosure, it is investigated that the rear surface rises from a minimum of 29° C. to a maximum of 36° C. Compared with the related art, it can be seen that the minimum temperature rises slightly, but the temperature change is also rapidly reduced like a case where a temperature difference is 14° C. in the relate art, while 7° C. in the present disclosure, and the maximum temperature also becomes lower than the maximum temperature in the related art by approximately 4° C.

When comparing the present disclosure with the related art, it can be seen that the structure of the wiring board according to the present disclosure effectively blocks the heat generated in the driver IC from propagating to the front surface, and also effectively discharges the heat to the outside.

FIG. 11 is a diagram for describing a display panel 141 which operates in units of blocks.

The panel 141 having the plurality of semiconductor light-emitting elements 150 may be driven in units of blocks.

On one surface of the wiring board, more precisely, on the front surface (a direction in which an image is displayed), countless semiconductor light-emitting elements 150 are arranged according to a resolution, and the driver IC 117 that inputs data into the semiconductor light-emitting elements 150 and displays an image may be disposed on the rear surface of the wiring board.

The light-emitting element 150 is divided into a plurality of blocks BL1, BL2, and BL3 in order to drive the semiconductor light-emitting element 150 installed on the panel, and with respect to each block, driver ICs 117a, 117b, and 117c installed in respective blocks may drive the semiconductor light-emitting elements 150 which belong to corresponding blocks. In the drawing, it is illustrated that the panel is divided into three blocks, and three driver ICs are disposed in order to drive respective blocks, but the present disclosure is not limited thereto, but the number of blocks or the number of driver ICs may be adjusted depending on each other or adjusted independently.

Meanwhile, before the present disclosure, the semiconductor light-emitting element 150 is connected to a semiconductor light-emitting element 150 adjacent thereto through the electrode lines formed on the wiring board in the block. However, the electrode lines are not formed in a dummy area DM between the blocks, so the dummy area is viewed in the form of a horizontal line or a vertical line, resulting in a poor appearance of a product. As illustrated in the drawing, the horizontal line is viewed.

The electrode lines of an embodiment are formed in the dummy area DM in order to solve the problem.

As illustrated in FIG. 11, the semiconductor light-emitting element 150 installed in the panel may be divided into the first block to the third block BL1 to BL3, and the first block BL1 may be driven by the first driver IC 117a, the second block BL2 may be driven by the second driver IC 117b, and the third block BL3 may be driven by the third driver IC 117c.

In addition, the dummy area DM is located between the first block BL1 and the second block BL2, and between the second block BL2 and the third block BL3 in a vertical direction. The dummy area DM represents a boundary between the block and the block.

In one example, the semiconductor light-emitting element 150 may be driven by a PM method. The PM method is a method in which scanning is performed for a time-divided time in a column or row direction by a time division method, and data is input in the row or column direction according to the time-divided time.

Meanwhile, the semiconductor light-emitting element 150 includes an anode electrode and a cathode electrode and receives data from the driver IC to emit light. In one example, the anode electrode may be used as a common electrode to which common voltage is applied, and the cathode electrode may be used as a data electrode to which data voltage is applied. Alternatively, in contrast, the anode electrode may be used as the data electrode and the cathode electrode may be used as the common electrode.

In the following description, for convenience of description, it is exemplified that the anode electrode is the common electrode and the cathode electrode is the data electrode.

Further, it is exemplified that the data voltage is input in the vertical direction. In this case, in the block, with respect to the semiconductor light-emitting element 150 and the semiconductor light-emitting element 150 adjacent thereto, cathodes are commonly connected and anodes are commonly connected in the vertical direction.

FIG. 12 is an enlarged diagram of part "B" of FIG. 11, FIG. 13 is a diagram illustrating a state in which the semiconductor light-emitting element 150 is removed from FIG. 12, and FIG. 14 is a diagram illustrating an arrangement of electrodes of the semiconductor light-emitting element.

Since data is input into each semiconductor light-emitting element 150 in the vertical direction, the cathode electrodes of other semiconductor light-emitting elements 150 adjacent to each other in the vertical direction, more precisely, the respective semiconductor light-emitting elements are commonly connected, and commonly connected through the electrode line formed on the front surface of the board, and the anode electrodes are commonly connected through another electrode line formed on the sub-board.

In this example, in the semiconductor light-emitting element 150, R, G, and B which are sub-pixels may be packaged into one. In this case, the semiconductor light-emitting element 150 is configured to include four electrodes as illustrated in FIG. 14.

The electrode includes first to fourth electrodes 151 to 154, and among them, the first to third electrodes 151 to 153 are sub-pixel-wise cathode electrodes, and the fourth electrode 154 is the cathode electrode commonly connected to the sub-pixel.

Meanwhile, in order to connect the semiconductor light-emitting element 150 in the vertical direction, each of the blocks BL1, BL2, and BL3 is configured to include the electrode line.

The electrode line commonly connects the first to third electrodes of the semiconductor light-emitting elements 150 adjacent in the vertical direction.

To this end, the electrode line may be configured to include pads to which the electrodes of the semiconductor light-emitting element 150 are bonded, and first to third connection patterns PT1 to PT3 commonly connecting electrodes of the semiconductor light-emitting elements 150*a* and 150*b* adjacent in the vertical direction.

The pads to which the electrodes 151 to 154 of the semiconductor light-emitting element 150 are attached include first to fourth pads P1 to P4 similarly to the semiconductor light-emitting element 150.

The first to third pads P1 to P3 are connected to the first to third electrodes 151 to 153 of the semiconductor light-emitting element 150, and the fourth pad P4 is connected to the fourth electrode 154 of the semiconductor light-emitting element 150. In one example, the fourth pad P4 to which the fourth electrode 154 serving as the common electrode is attached may be configured to include a via hole Th to be connected to another fourth electrode 154 adjacent thereto on another layer.

Here, the board includes the plurality of sub-boards as described above, and another layer of the board means the remaining sub-board except for the sub-board having the electrode line among the plurality of sub-boards.

In each block, the first pads P1 are connected by the first connection pattern PT1, the second pads P2 are connected by the second connection pattern PT2, and the third pads P3 are connected by the third connection pattern PT3, and as a result, the first pads P1 may be commonly connected, the second pads P2 may be commonly connected, the third pads P3 may be commonly connected, and the fourth pad P4 may be commonly connected through the via hole TH in the block.

Further, in an embodiment, the electrode line is configured to further include a dummy pattern formed in the dummy area DM. The dummy pattern is formed in the dummy area DM to prevent a viewing phenomenon of the horizontal line or the vertical line, which occurs due to pattern omission when the panel is viewed from the outside. In one example, the dummy patterns may be formed with a number which is the same as the number of connection patterns connecting the pads.

That is, as exemplified, the dummy pattern may include first to third dummy patterns DP1 to DP3. Here, the first dummy pattern DP1 is configured to have a similar shape to the first connection pattern PT1, the second dummy pattern DP2 is configured to have the similar shape to the second connection pattern PT2, and the third dummy pattern DP3 is configured to have the similar shape to the third connection pattern PT3.

According to this, since a pattern of a similar form to being viewed in each block is formed even in the dummy area DM, a problem in that there is no pattern in the dummy area and the horizontal line or the vertical line is viewed in the related art may be solved.

The dummy pattern is not connected to the pad differently from the first to third connection patterns PT1 to PT3. That is, the dummy pattern just has a shape, and is not a component that electrically connects the semiconductor light-emitting element 150.

As illustrated, the first connection pattern PT1 is located at a left side of the semiconductor light-emitting element, the third connection pattern PT3 is located at a right side, and the second connection pattern PT2 is located between the first and third connection patterns, between two semiconductors adjacent in the vertical direction.

Similar thereto, the first dummy pattern DP1 is disposed at the left side, the third dummy pattern DP3 is disposed at the right side, and the second dummy pattern DP2 is disposed between the first and third dummy patterns.

FIG. 15 is an enlarged diagram of a dummy pattern. As illustrated in FIG. 15, each of the first to third dummy patterns DP1 to DP3 is formed away from the pad or the first to third connection patterns. In this case, each of the first to third dummy patterns DP1 to DP3 is disposed away from the semiconductor light-emitting element 150 to prevent electric connection with the semiconductor light-emitting element 150.

However, since the dummy pattern illustrated in FIG. 15 is formed away from the semiconductor light-emitting element 150, a difference may be visually felt.

Considering this point, the dummy pattern may be formed as illustrated in FIG. 16.

FIG. 16 is a diagram illustrating another example of the dummy pattern. As illustrated in FIG. 16, at least one of the first to third dummy patterns DP1 to DP3 allows the end of the pattern to be located inward from the semiconductor light-emitting element 150 to prevent the ends of the first to third dummy patterns DP1 to DP3 from being exposed to the outside.

In the example of FIG. 16, one end of the first dummy pattern DP1 is connected to the first pad P1 of the second semiconductor light-emitting element 150*b*, but the other end may be located between the first pad P1 and the second pad P2 of the first semiconductor light-emitting element 150*a*. Therefore, both ends of the first dummy pattern DP1 is shielded by the semiconductor light-emitting elements 150*a* and 150*b* to prevent the end from being viewed.

The second dummy pattern DP2 and the third dummy pattern DP3 may also be formed similarly to the first dummy pattern DP1. One end of the second dummy pattern DP2 may be connected to the second pad P2 of the first semiconductor light-emitting element, and the other end may be disposed between the first electrode 151 and the fourth electrode 154 of the second semiconductor light-emitting element 150*b*. Similarly, one end of the third dummy pattern DP3 may be connected to the third pad P3 of the first semiconductor light-emitting element 150*a*, and the other end may be disposed between the third electrode P3 and the fourth pad P4 of the second semiconductor light-emitting element 150*b*.

FIGS. 17 and 18 are diagrams illustrating an example in which the semiconductor light-emitting element is packaged for each sub-pixel, and FIG. 18 illustrates a state in which the semiconductor light-emitting element is removed from FIG. 17.

In this example, the semiconductor light-emitting element 150 includes first to third semiconductor light-emitting elements 150*a* to 150*c*, and the first semiconductor light-emitting element 150*a* exhibits red (R), the second semiconductor light-emitting element 150b exhibits green (G), the third semiconductor light-emitting element 150c exhibits blue (B), and the first to third semiconductor light-emitting elements 150a to 150c are gathered to form one pixel.

Each of the first to third semiconductor light-emitting elements 150a to 150c includes a cathode electrode to which data voltage is applied and an anode electrode to which common voltage is applied. Here, the first to third semiconductor light-emitting elements 150a to 150c do not individually have the anode electrodes, which are commonly connected.

The electrode line includes the first to third pads P1 to P3 connected to the cathodes of the first to third semiconductor light-emitting elements 150a to 150c, respectively, and the fourth pad P4 commonly connected to the anode electrodes of the first to third semiconductor light-emitting elements 150a to 150c.

In one example, the first pad P1 may be connected to the first pad P1 of a next pixel through a first via hole TH1 in the vertical direction. In this case, the first pad P1 may be configured to include the first via hole TH1. Further, the third pad P3 may be connected to the third pad P3 of the next pixel through a second via hole TH2, and in this case, the third pad P3 is configured to include the second via hole TH2.

Further, the second pad P2 may be connected to the second pad P2 of the next pixel through a conductive pattern PT.

In addition, the fourth pad P4 is commonly connected to the anode electrodes of the first to third semiconductor light-emitting elements 150a to 150c. The fourth pad P4 may be connected to the fourth pad P4 of an adjacent pixel through a third via hole TH3, and in this case, the fourth pad P4 is configured to include the third via hole TH3.

Meanwhile, the electrode line may be configured to further include the dummy pattern DP formed in the dummy area DM. In this example, the dummy pattern DP may be configured to have substantially the same shape as the conductive pattern.

If the conductive pattern includes the via hole, the dummy pattern DP is also configured to include the via hole, so the conductive pattern and the dummy pattern are configured to visually have the same shape.

While this invention has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

The invention claimed is:

1. A display device comprising:
   a wiring board having a plurality of electrode lines formed on a front surface thereof; and
   a plurality of semiconductor light-emitting elements disposed on the wiring board and electrically connected to each other by the plurality of electrode lines, wherein the wiring board is configured to include at least two physically divided sub-boards,
   wherein the at least two physically divided sub-boards are spaced apart from each other to form a heat dissipation passage therebetween, and
   wherein the wiring board includes:
   a first sub-board having the plurality of electrode lines formed on a front surface thereof and a first pad connected to the plurality of electrode lines formed on a rear surface thereof; and
   a second sub-board having a driver IC generating electric signals transmitted to the semiconductor light-emitting elements disposed on a rear surface thereof and a second pad connected to the driver IC, which is formed on the front surface thereof.

2. The display device of claim 1, wherein the wiring board further includes,
   a third sub-board located between the first sub-board and the second sub-board,
   wherein the third sub-board includes a third pad connected to the first pad of the first sub-board and disposed on a front surface thereof, and a fourth pad electrically connected to the second pad of the second sub-board and disposed on a rear surface.

3. The display device of claim 2, wherein the third sub-board includes a plurality of contact holes connecting the third and fourth pads and heat radiation holes formed between adjacent first and second contact holes among the plurality of contact holes.

4. The display device of claim 3, wherein the plurality of contact holes has connection electrodes physically connecting the third and fourth pads, and the heat dissipation passage is emptied.

5. The display device of claim 3, wherein the first pad and the third pad, and the second pad and the fourth pad are electrically and physically connected by a solder having a predetermined height.

6. The display device of claim 5, wherein the solder includes a first solder melting at a first temperature and a second solder melting at a temperature higher than the first temperature.

7. The display device of claim 1, wherein all of the sub-boards are printed circuit boards (PCBs).

8. The display device of claim 2, wherein all of the sub-boards are printed circuit boards (PCBs).

9. The display device of claim 3, wherein all of the sub-boards are printed circuit boards (PCBs).

10. The display device of claim 4, wherein all of the sub-boards are printed circuit boards (PCBs).

11. The display device of claim 5, wherein all of the sub-boards are printed circuit boards (PCBs).

12. The display device of claim 6, wherein all of the sub-boards are printed circuit boards (PCBs).

\* \* \* \* \*